(12) United States Patent
Mani

(10) Patent No.: US 9,395,410 B2
(45) Date of Patent: Jul. 19, 2016

(54) INTEGRATED CIRCUIT WITH SENSING UNIT AND METHOD FOR USING THE SAME

(75) Inventor: Krishnakumar Mani, San Jose, CA (US)

(73) Assignee: III HOLDINGS 1, LLC, Wilmington, DE (US)

(\*) Notice: Subject to any disclaimer, the term of this patent is extended or adjusted under 35 U.S.C. 154(b) by 447 days.

(21) Appl. No.: 13/153,472

(22) Filed: Jun. 6, 2011

(65) Prior Publication Data

US 2015/0355272 A1 Dec. 10, 2015

(51) Int. Cl.
| | |
|---|---|
| *G01R 27/08* | (2006.01) |
| *G01R 31/28* | (2006.01) |
| *G01R 31/30* | (2006.01) |
| *G11C 5/00* | (2006.01) |
| *H01F 1/00* | (2006.01) |
| *H01L 21/00* | (2006.01) |

(52) U.S. Cl.
CPC ........ *G01R 31/2884* (2013.01); *G01R 31/3004* (2013.01); *G11C 5/00* (2013.01); *H01F 1/00* (2013.01); *H01L 21/00* (2013.01)

(58) Field of Classification Search
CPC .............. H01L 21/00; G11C 5/00; H01F 1/00
USPC ............ 324/301, 207.21, 210, 212, 219, 239, 324/244, 246, 249, 252, 259, 260; 338/32 R
See application file for complete search history.

(56) References Cited

U.S. PATENT DOCUMENTS

| | | | | |
|---|---|---|---|---|
| 7,078,906 | B2 * | 7/2006 | Nelson | 324/327 |
| 7,266,034 | B2 * | 9/2007 | Hirai et al. | 365/222 |
| 7,414,396 | B2 * | 8/2008 | Chung | B82Y 25/00 324/244 |
| 7,541,804 | B2 * | 6/2009 | Chung | G01R 33/06 324/244 |
| 2003/0094944 | A1 * | 5/2003 | Suzuki et al. | 324/252 |
| 2004/0093551 | A1 * | 5/2004 | Asano | 714/765 |
| 2005/0073878 | A1 * | 4/2005 | Lin et al. | 365/158 |
| 2005/0242804 | A1 * | 11/2005 | Hintz et al. | 324/244 |
| 2006/0013039 | A1 * | 1/2006 | Braun et al. | 365/171 |
| 2006/0233002 | A1 * | 10/2006 | Wang et al. | 365/1 |
| 2007/0013015 | A1 * | 1/2007 | Kai et al. | 257/421 |
| 2007/0030747 | A1 * | 2/2007 | Hirai et al. | 365/222 |
| 2007/0297223 | A1 * | 12/2007 | Chen et al. | 365/173 |
| 2008/0314147 | A1 * | 12/2008 | Nasiri et al. | 73/514.32 |
| 2010/0007344 | A1 * | 1/2010 | Guo | G01R 33/098 324/260 |
| 2010/0177551 | A1 * | 7/2010 | Chen et al. | 365/148 |
| 2011/0001473 | A1 * | 1/2011 | Moriyama et al. | 324/244 |

\* cited by examiner

*Primary Examiner* — Huy Q Phan
*Assistant Examiner* — Temilade Rhodes-Vivour
(74) *Attorney, Agent, or Firm* — McAndrews, Held & Malloy, Ltd.

(57) ABSTRACT

Integrated circuit comprising a sensing unit that includes a sensing circuit, two conductors and a magnetic storage element. The sensing circuit monitors a voltage drop across the element when a current is passed between the conductors with the element in between. The voltage drop is pre-calibrated to indicate a change in conductivity in the element that is caused by an external magnetic field. Advantageously, this indication is usable particularly for assessing a possible data corruption in a magnetic memory circuit in the integrated circuit, due to stray and external magnetic fields. Methods of using the sensing unit are also proposed.

13 Claims, 5 Drawing Sheets

INTEGRATED CIRCUIT WITH SENSING UNIT AND METHOD FOR USING THE SAME

FIELD

Embodiments of the invention relate to the field of integrated circuits and particularly to those using magnetic storage elements.

BACKGROUND

Magnetic memory circuits are based on magneto-resistive behavior of magnetic storage elements that are integrated typically with a complementary metal-oxide semiconductor (CMOS) technology. Such memory circuits generally provide non-volatility and an unlimited read and write capability. An example is the magnetic random access memory (MRAM) circuit that includes a plurality of bits, each defining an addressable magnetic storage element stack that may include a magnetic tunnel junction (MTJ).

Each MTJ addressable magnetic element stack includes a free layer having a magnetic spin orientation that can be flipped between two states by the application of a magnetic field induced by energizing write conductors.

SUMMARY OF THE INVENTION

According to an embodiment of a first aspect of the invention, an integrated circuit comprises a sensing unit, that further comprises two conductors, a magnetic storage element disposed between the two conductors and a sensing circuit. The element has no stored data. The sensing circuit monitors a voltage drop across the element when a current is passed between the two conductors and through the element. The voltage drop is pre-calibrated to indicate a change in conductivity in the element, the change being caused by an external magnetic field.

According to another embodiment of the first aspect, the integrated circuit comprises multiple sensing units, wherein each element has a different aspect ratio for indicating the change with improved sensitivity, when the change is caused by the magnetic field from a particular direction.

According to another embodiment of the first aspect, the integrated circuit further comprises a multiplexer for controlling operation of the multiple sensing units.

According to another embodiment of the first aspect, the integrated circuit includes a magnetic random access memory (MRAM) circuit that comprises an array of addressable magnetic storage elements.

According to another embodiment of the first aspect, each of the addressable elements comprises an MTJ stack.

According to a second aspect, a method of using an integrated circuit comprising a sensing unit is proposed. The sensing unit comprises a magnetic storage element, two conductors and a sensing circuit. The method is to monitor a voltage drop across the magnetic storage element by the sensing circuit, when a current is passed between the two conductors and through the element. The element has no stored data. The voltage drop is pre-calibrated to indicate a change in conductivity in the element, the change being caused by an external magnetic field.

According to embodiments of the first and second aspects, the element comprises a magnetic tunnel junction (MTJ) stack.

According to embodiments of the first and second aspects, the voltage drop is pre-calibrated to further indicate when the change exceeds a pre-determined threshold value.

According to embodiments of the first and second aspects, the sensing unit further comprises at least one of the following devices for indicating the change: an audio indicator and a visual indicator.

According to an embodiment of the second aspect, wherein the integrated circuit includes a magnetic random access memory (MRAM) circuit that comprises an array of addressable magnetic storage elements, the method further comprises using the indication on the change in conductivity for assessing possible data corruption in the addressable magnetic storage elements, due to the external magnetic field.

According to a third aspect, a method of using an integrated circuit comprising multiple sensing units is proposed, wherein each sensing unit comprises a magnetic storage element, two conductors and a sensing circuit. The method is to further monitor a voltage drop across a magnetic storage element by a sensing circuit in a selected sensing unit, when a current is passed between the two conductors and through the element. The element has no stored data. The voltage drop is pre-calibrated to indicate a change in conductivity in the element, the change being caused by an external magnetic field. Herein, each element has a different aspect ratio for indicating the change with improved sensitivity, when the change is caused by the magnetic field from a particular direction.

According to an embodiment of the third aspect, the method further comprises operating the sensing units by a multiplexer that is disposed in the integrated circuit.

According to the embodiments of the invention, the sensing unit in the integrated circuit indicates a change in conductivity in a magnetic storage element, that is caused by an external and stray magnetic field. This indication is useful particularly for an assessment of the possible data corruption in a magnetic memory circuit included in the integrated circuit, due to the same external and stray magnetic field.

DETAILED DESCRIPTION

In the following description, for purposes of explanation, numerous specific details are set forth in order to provide a thorough understanding of the invention. It will be apparent, however, to one skilled in the art that the invention can be practiced without these specific details.

Reference in this specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

Broadly, embodiments of the invention disclose an integrated circuit with at least one sensing unit and methods for using the same. The sensing unit indicates a change in conductivity in a magnetic storage element that is caused by an external magnetic field. Advantageously, this indication is usable particularly for assessing a possible data corruption in a magnetic memory circuit in the integrated circuit, due to stray and external magnetic fields. The undesirable effect of the external magnetic field on the magnetic storage element is likely to be less severe when the integrated circuit is in a package, than otherwise. The magnetic memory circuit generally includes addressable magnetic storage elements that are designed to be flipped between two states by the application of a magnetic field induced by energizing write conductors. According to an embodiment of the invention, the magnetic memory circuit can be rated for reliable performance up to a certain magnitude of the external magnetic field, as indicated by the sensing unit. When this magnitude is exceeded, the sensing unit can raise an alarm for the user. The embodiments of the invention are useful particularly though not exclusively for use with magnetic memory circuits like a magnetic random access memory (MRAM) circuit that uses magnetic storage elements, like for example magnetic tunnel junctions (MTJs).

Figure 1A:
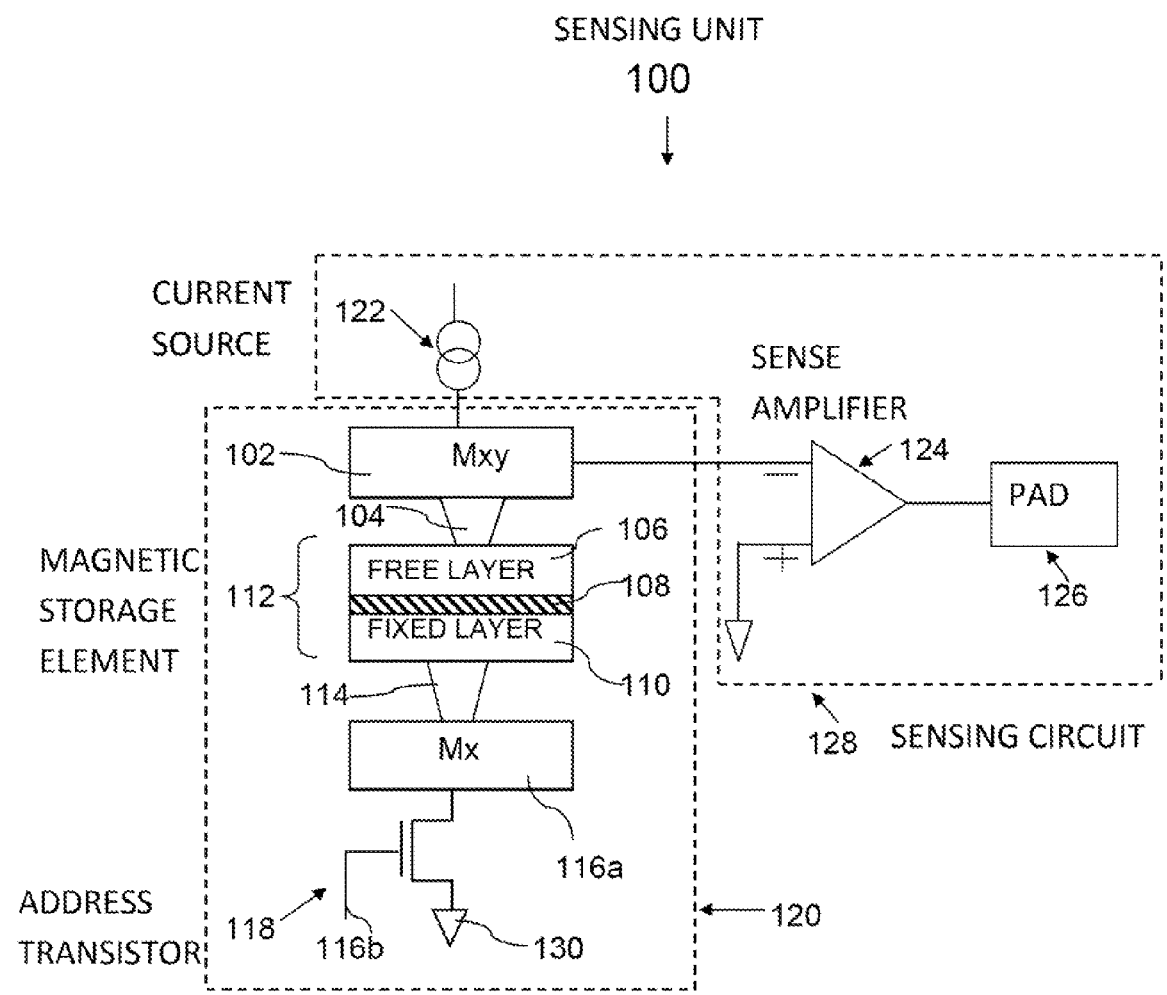
FIG. 1A shows a partly schematic and partly cross-sectional view of a sensing unit, in accordance with an embodiment of a first aspect of the invention.
Figure 1B:
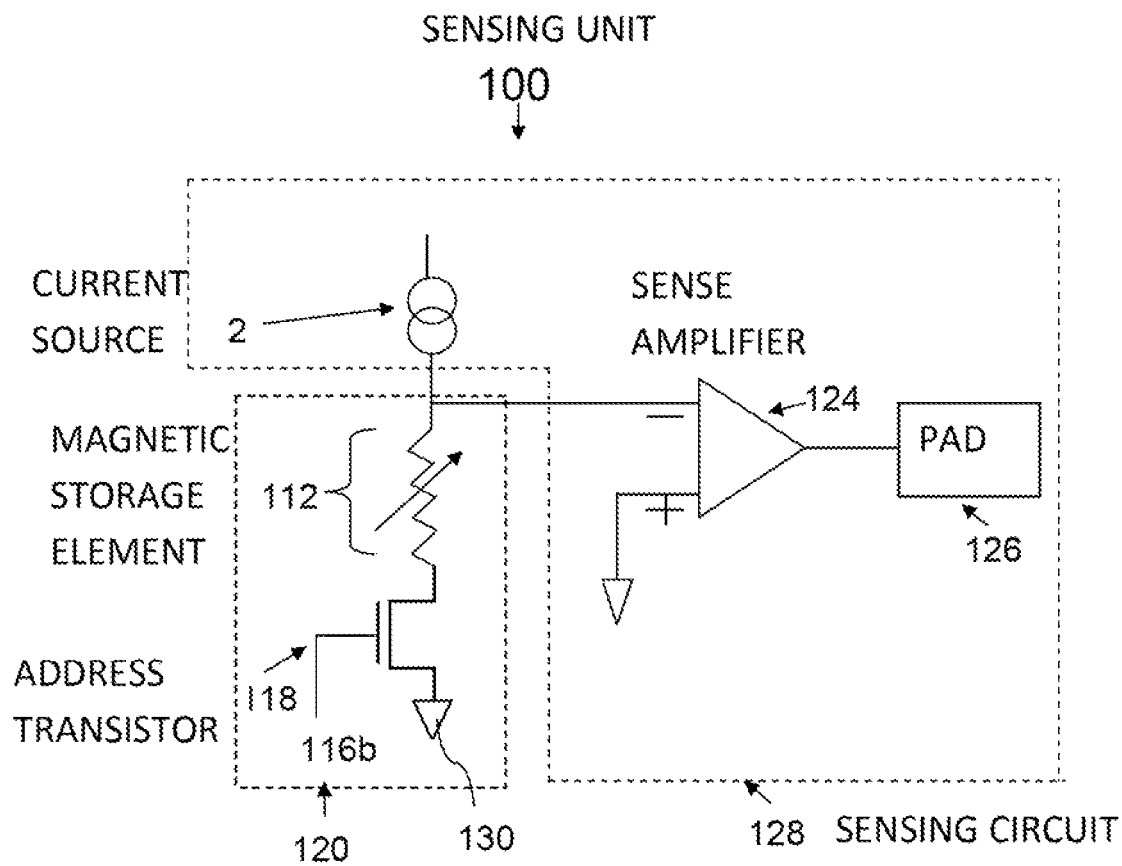
FIG. 1B shows a full schematic view of FIG. 1A.
Figure 1C:
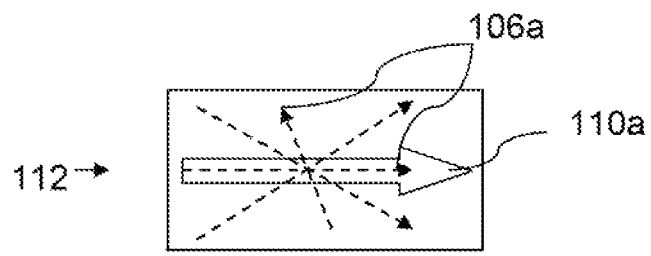
FIG. 1C shows a planar view of a magnetic tunnel junction (MTJ), wherein a fixed magnetic orientation of a fixed layer is shown by a block arrow and possible variable magnetic orientations of a free layer are shown by multiple dashed line arrows.
Figure 2:
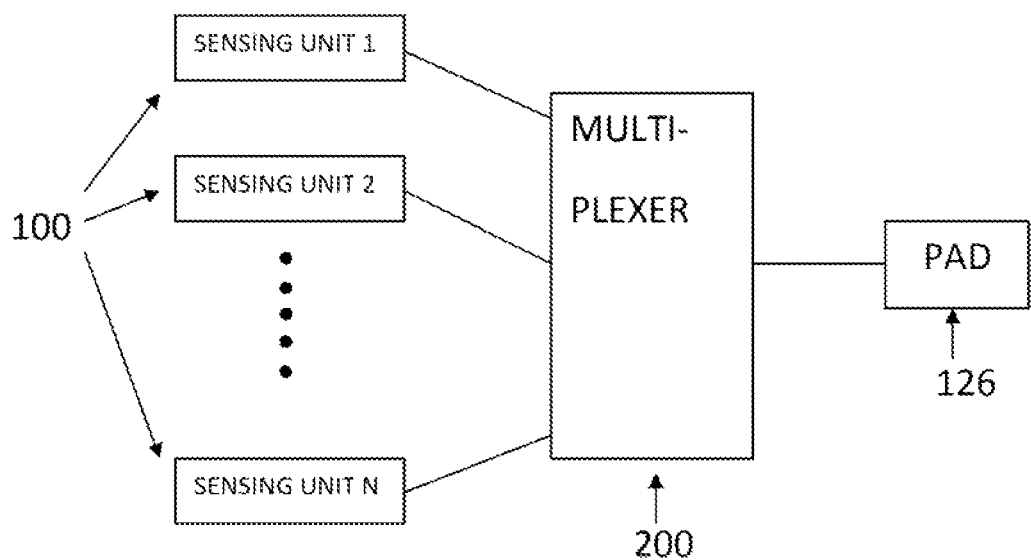
FIG. 2 shows a schematic view of an arrangement for operating multiple sensing units by a multiplexer.
Figure 3:
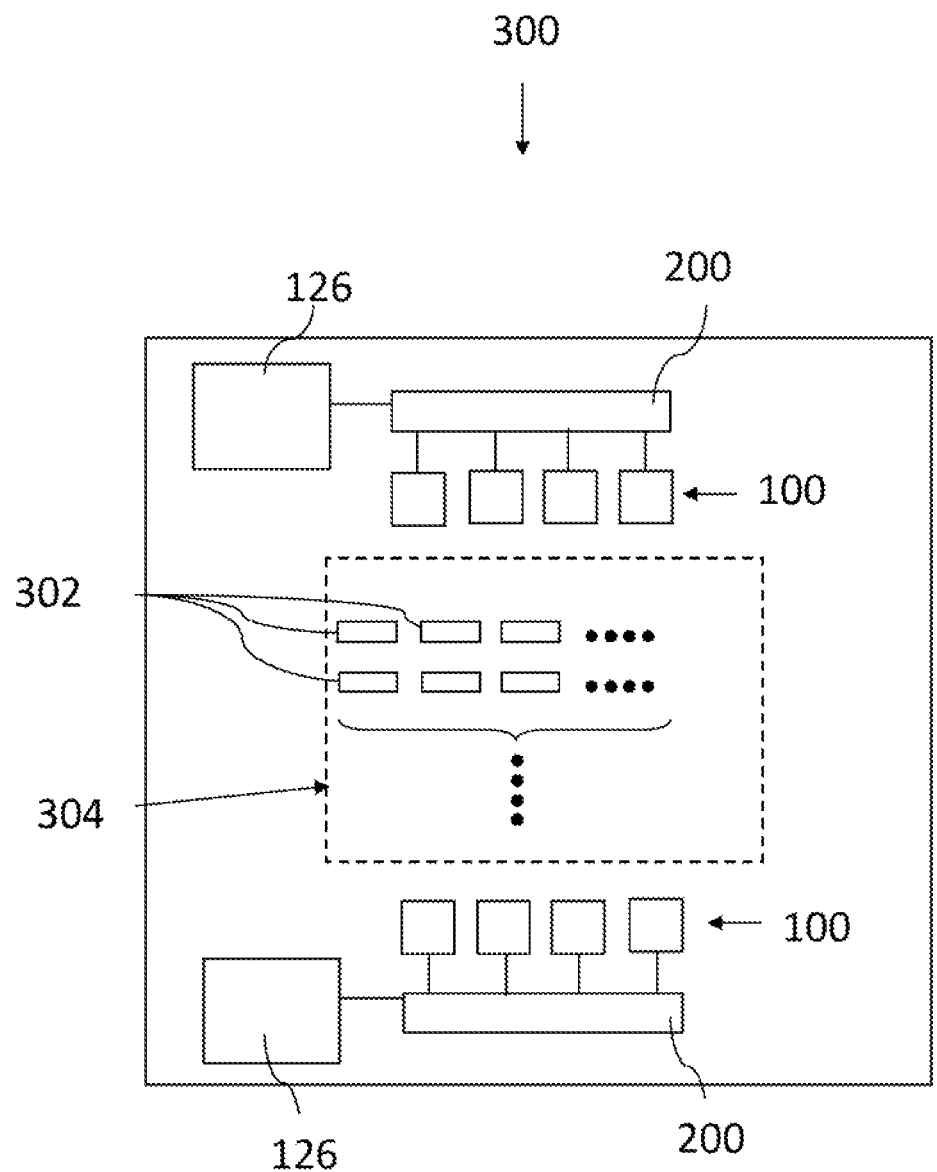
FIG. 3 shows an exemplary integrated circuit layout that includes an array of memory cells for a magnetic random access memory (MRAM) circuit and two sets of a multiplexer arranged to control operation of multiple sensing units, according to an embodiment of the invention.
Figure 4:
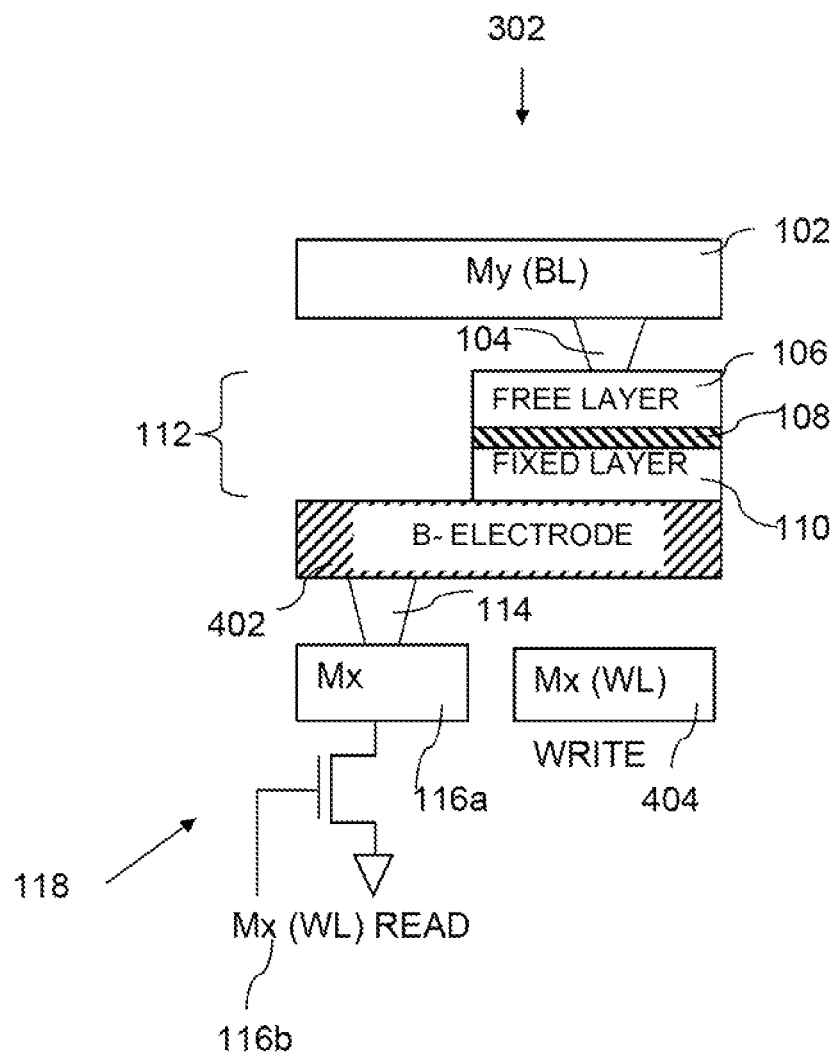
FIG. 4 shows a partly schematic and partly cross-sectional view of a memory cell, in accordance with an embodiment of a first aspect of the invention.

Referring now to FIG. 1A of the drawings, there is shown a view of a sensing unit 100, in accordance with an embodiment of the invention. A section 120 shows a cross-sectional view of a magnetic storage element 112 between a first conductor 116a and a second conductor 102. In this embodiment, the element 112 is a magnetic tunnel junction (MTJ), comprising a free layer 106, a tunnel oxide layer 108 and a fixed layer 110. In this embodiment, the first conductor 116a is a metal layer Mx and the second conductor 102 is another metal layer My. In another embodiment, other types of conductors like for example highly doped polysilicon may also be used. In this embodiment, the element 112 is connected to the first conductor 116a through a first via hole 114 and to the second conductor 102 through a second via hole 104. The first conductor 116a is connected to a schematically shown address transistor 118 with a gate electrode 116b for controlling the flow of a current between the two conductors 116a, 102 and through the element 112 only when required and not otherwise, to reduce power consumption. The sensing unit 100 has a schematically shown sensing circuit 128, that has a current source 122, a sense amplifier 124 and a probing pad 126. In operation, when the address transistor 118 is turned 'on', a current from the current source 122 flows through the second conductor 102, the element 112, the first conductor 116a and the address transistor 118, to the ground terminal 130. Consequently, the voltage drop that is generated by the element 112 is accessible at the second conductor 102, that is further amplifiable by the sense amplifier 124 for being measurable at the probing pad 126. The voltage drop is dependent on the resistivity or conductivity of the element 112, that is in turn dependent on the magnetic orientation of the free layer 106. An external magnetic field can modulate the magnetic orientation of the free layer 106 and accordingly affect the resistivity or conductivity of the element 112. In another embodiment, any other type of sensing circuit 128 may equally be used for monitoring the voltage drop and for indicating the resistivity or conductivity of the element 112, when under the influence of external magnetic fields at various magnitudes and directions. FIG. 1B shows a full schematic view of FIG. 1A, where the element 112 is represented by a symbol for a variable resistor. FIG. 1C shows a planar view of the magnetic storage element 112, which in this embodiment is a magnetic tunnel junction (MTJ). A fixed magnetic orientation of the fixed layer 110 is shown by a block arrow 110a and possible variable magnetic orientations of the free layer 106 under the influence of the external magnetic fields in different directions, are shown by multiple dashed line arrows 106a. FIG. 2 shows a schematic view for an arrangement of controlling operations of multiple sensing units 100 by a multiplexer 200, according to an embodiment. In the multiple sensing units 100, each element 112 has a different length to breadth ratio (aspect ratio), for indicating the change in resistivity or conductivity with improved sensitivity, when caused by the magnetic field from a particular direction. FIG. 3 shows an exemplary integrated circuit layout 300, according to an embodiment of the invention. The layout 300 includes an array 304 of memory cells 302 for a magnetic random access memory (MRAM) circuit. In the proximity of the array 304, two sets of a multiplexer 200 arranged to control operation of multiple sensing units 100 are shown. The probing pad 126 from either multiplexer 200 is also shown. FIG. 4 shows a partly schematic and partly cross-sectional view of the memory cells 302, in accordance with an embodiment. As will be seen, the memory cells 302 each include an MTJ as the magnetic storage element 112, as in the sensing unit 100. This embodiment is favorable towards the processing complexity and cost, as the element 112 in both the memory cell 302 and the sensing unit 100 may be processed simultaneously. The memory cells 302 each also include an extended bottom electrode 402 that also accommodates a write word line (WL) 404, like for example with the same metal layer Mx. The write WL 404 is used inductively during the write operations for the element 112. The gate electrode 116b is usable as a read WL for controlling the address transistor 118 during the read operations.

According to another embodiment, the sensing unit 100 includes an audio/visual indicator (not shown) for indicating the change in resistivity or conductivity. The indicator may also indicate when the change exceeds a pre-determined threshold value. This indication can be used to alert a user of the integrated circuit, when the magnetic memory circuit is not reliable for use under the influence of the existing external magnetic field.

When the sensing unit(s) in the integrated circuit is/are intended to be used for assessing possible data corruption in a magnetic memory circuit due to stray magnetic fields, the sensing unit(s) may preferably be disposed close to the addressable magnetic storage elements in the memory circuit, for a better correlation.

The embodiments of the invention are compatible with any semiconductor technology such as complementary metal-oxide-semiconductor (CMOS), bipolar-junction-transistor and CMOS (BiCMOS), silicon-on-insulator (SOI) and the like. The scope of the invention is also not limited to any particular technology in terms of processing sequence, materials, physical dimensions and the like.

Although the present invention has been described with reference to specific exemplary embodiments, it will be evident that the various modification and changes can be made to these embodiments without departing from the broader spirit of the invention. Accordingly, the specification and drawings are to be regarded in an illustrative sense rather than in a restrictive sense.

The invention claimed is:

1. A circuit comprising:
a first conductor;
a second conductor;
a magnetic memory circuit including a magnetic storage element disposed between the said first and second conductors, wherein the magnetic storage element comprises a magnetic tunnel junction (MTJ) stack;
a sensing circuit configured to determine a change in conductivity of the magnetic storage element by monitoring a voltage drop across the magnetic storage element when a constant current is passed from the first conductor to the second conductor, thereby passing through the magnetic storage element; and
an indicator configured to indicate that the magnetic storage element is not reliable for use when the change in conductivity exceeds a pre-determined value.

2. The circuit of claim 1, wherein the indicator comprises at least one of an audio indicator or a visual indicator.

3. The circuit of claim 1, wherein the magnetic storage element is configured to not contain any stored data when the sensing circuit monitors the voltage drop across the magnetic storage element.

4. A method of using a circuit, the method comprising:
using a sensing unit in the circuit, wherein the sensing unit comprises a magnetic memory circuit including a magnetic storage element, two conductors, and a sensing circuit, and wherein the magnetic storage element comprises a magnetic tunnel junction (MTJ) stack;
determining, by the sensing circuit, a change in conductivity of the magnetic storage element by monitoring a voltage drop across the magnetic storage element when a constant current is passed from a first of the two conductors to a second of the two conductors, thereby passing through the magnetic storage element; and
indicating, by an indicator, that the magnetic storage element is not reliable for use when the change in conductivity exceeds a pre-determined value.

5. The method of claim 4, wherein the indicator comprises at least one of an audio indicator or a video indicator.

6. The method of claim 4, wherein the magnetic storage element does not contain any stored data when the sensing circuit monitors the voltage drop across the magnetic storage element.

7. A method of using a circuit, the method comprising:
using a plurality of sensing units in the circuit, wherein each of the plurality of sensing units comprises a magnetic memory circuit including a magnetic storage element, two conductors, and a sensing circuit, and wherein the magnetic storage element comprises a magnetic tunnel junction (MTJ) stack;
in each of the plurality of sensing units, determining, by the sensing circuit, a change in conductivity of the magnetic storage element by monitoring a voltage drop across the magnetic storage element by said sensing circuit when a constant current is passed from a first of the two conductors to a second of the two conductors, thereby passing through the magnetic storage element; and
indicating, by an indicator, that the plurality of magnetic storage elements is not reliable for use when the change in conductivity exceeds a pre-determined value.

8. The method of claim 7, further comprising:
operating the sensing units by a multiplexer that is disposed in the circuit.

9. The method of claim 7, wherein each of the plurality of magnetic storage elements has a different aspect ratio for indicating the change in conductivity with improved sensitivity when the change in conductivity in the magnetic storage element is caused by a magnetic field from a particular direction.

10. The method of claim 7, wherein a selected magnetic storage element is storing no data when a sensing unit is monitoring a voltage drop across the selected magnetic storage element.

11. A circuit comprising:
a first conductor;
a second conductor;
a magnetic memory circuit including a magnetic storage element comprising a magnetic tunnel junction (MTJ) stack including:
a fixed layer electrically connected to the first conductor;
a tunnel oxide layer above the fixed layer; and
a free layer above the tunnel oxide layer, wherein the second conductor is electrically connected to the free layer;
at least one constant current source configured to drive a constant current from the first conductor to the second conductor, thereby passing through the magnetic storage element;
sensing circuitry configured to measure the conductivity of the magnetic storage element while the constant current is driven from the first conductor to the second conductor; and
an indicator configured to indicate that the magnetic storage element is not reliable for use when a change in conductivity exceeds a pre-determined value.

12. A circuit comprising:
a plurality of first conductors;
a plurality of second conductors;
a plurality of magnetic memory circuits including a corresponding plurality of magnetic storage elements, wherein each of the plurality of magnetic storage elements includes a fixed layer electrically connected to one of the plurality of first conductors, and wherein each of the plurality of magnetic storage elements includes a free layer electrically connected to one of the plurality of second conductors, and wherein each of the plurality of magnetic storage elements comprises a magnetic tunnel junction (MTJ) stack;
a plurality of sensing circuitries corresponding to the plurality of magnetic storage elements;
wherein:
at least one constant current source is configured to drive constant currents from each of the first conductors to a respective one of each of the second conductors, thereby passing through a respective one of the plurality of magnetic storage elements; and
the plurality of sensing circuitries is configured to measure a change in conductivity in the plurality of magnetic storage elements if the constant currents are passed through the plurality of magnetic storage elements; and
an indicator configured to indicate that the plurality of magnetic storage elements is not reliable for use when the change in conductivity exceeds a pre-determined value.

13. The circuit of claim 12, wherein each of the plurality of magnetic storage elements comprises a different aspect ratio.

* * * * *